United States Patent [19]

Septfons et al.

[11] Patent Number: 4,603,243
[45] Date of Patent: Jul. 29, 1986

[54] COMPONENT FIXING MACHINE FOR HYBRID CIRCUITS

[75] Inventors: René Septfons, Paris; Jean Chenu, Palaiseau; both of France

[73] Assignee: Compagnie Industrielle des Telecommunications CIT-ALCATEL, Paris, France

[21] Appl. No.: 672,438

[22] Filed: Nov. 16, 1984

[30] Foreign Application Priority Data

Nov. 18, 1983 [FR] France ............................ 83 18379

[51] Int. Cl.⁴ ............................................. B23K 3/04
[52] U.S. Cl. ............................. 219/85 BA; 219/85 R; 219/347; 165/61; 165/86
[58] Field of Search .......... 219/85 BA, 85 BM, 85 R, 219/85 M, 354, 347, 348; 228/180.1, 180.2; 165/61, 86

[56] References Cited

U.S. PATENT DOCUMENTS 3,562,481 2/1971 West ................................. 219/85 R
3,765,475 10/1973 Hooper ........................... 219/347 X
3,973,711 8/1976 Perego ................................. 228/32
4,034,180 7/1977 Kokusai ......................... 219/85 BM
4,356,384 10/1982 Gat ..................................... 219/347

FOREIGN PATENT DOCUMENTS 2328172 1/1974 Fed. Rep. of Germany .
2047686 3/1971 France .
950048 2/1964 United Kingdom .
2041809 9/1980 United Kingdom .
2063134 6/1981 United Kingdom .

Primary Examiner—Clarence L. Albritton
Assistant Examiner—C. M. Sigda
Attorney, Agent, or Firm—Sughrue, Mion, Zinn, Macpeak and Seas

[57] ABSTRACT

A component fixing machine for hybrid circuits including heating station (5) and a cooling station (6) which are both mounted on a common carriage (17) which is driven in translation back and forth under a fixed station (4) for holding the substrate (1) above the carriage.

11 Claims, 8 Drawing Figures

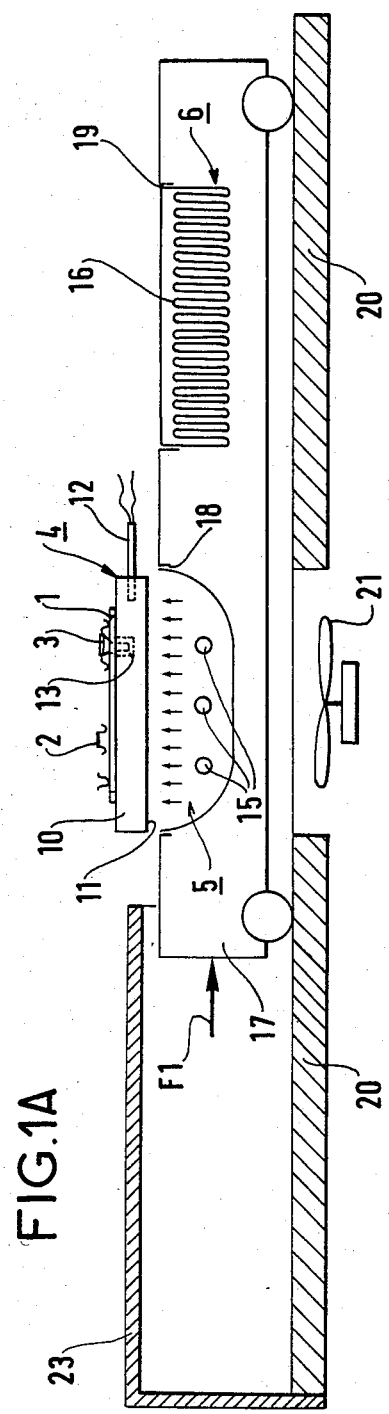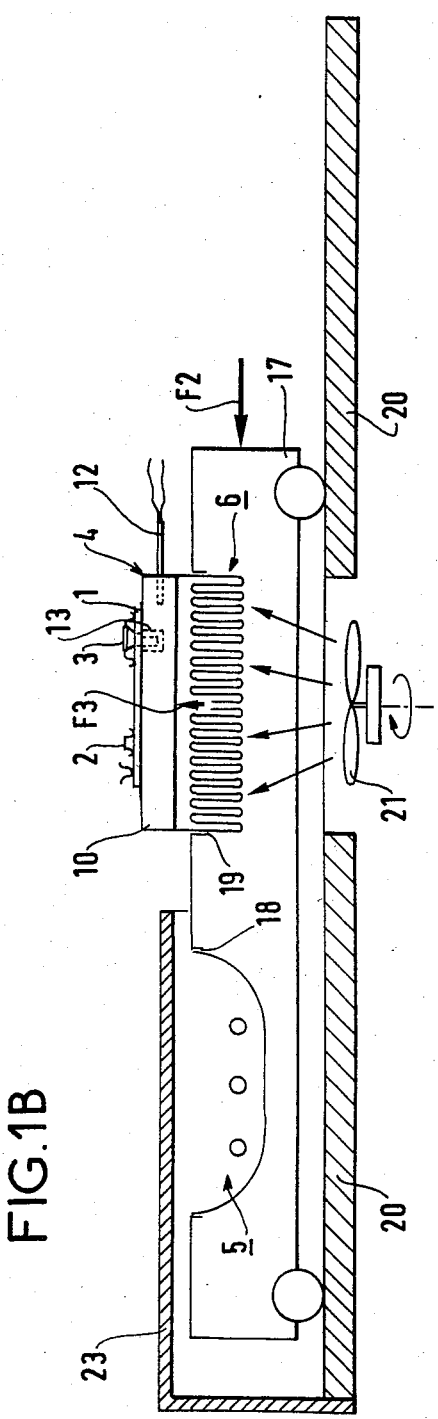

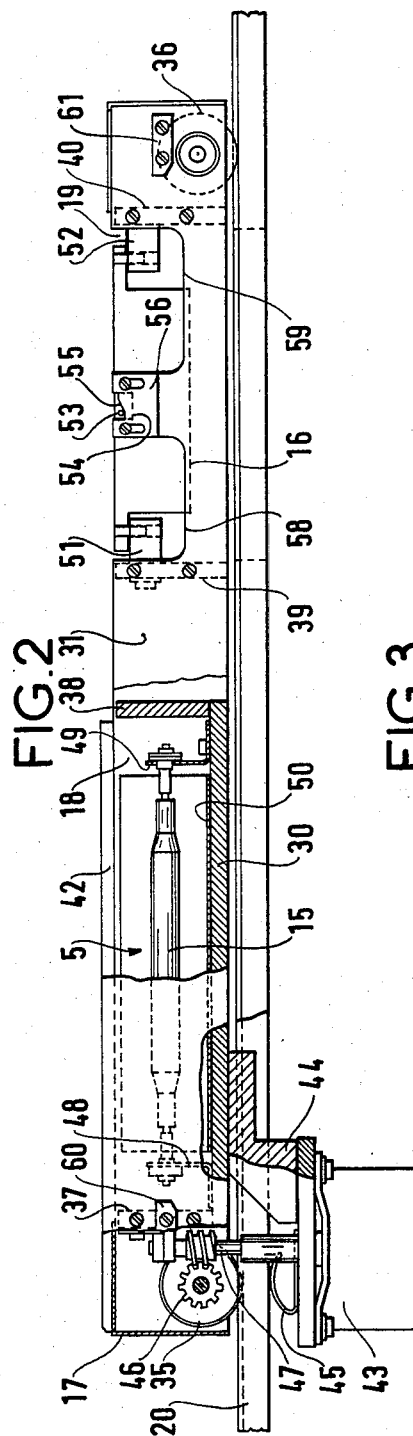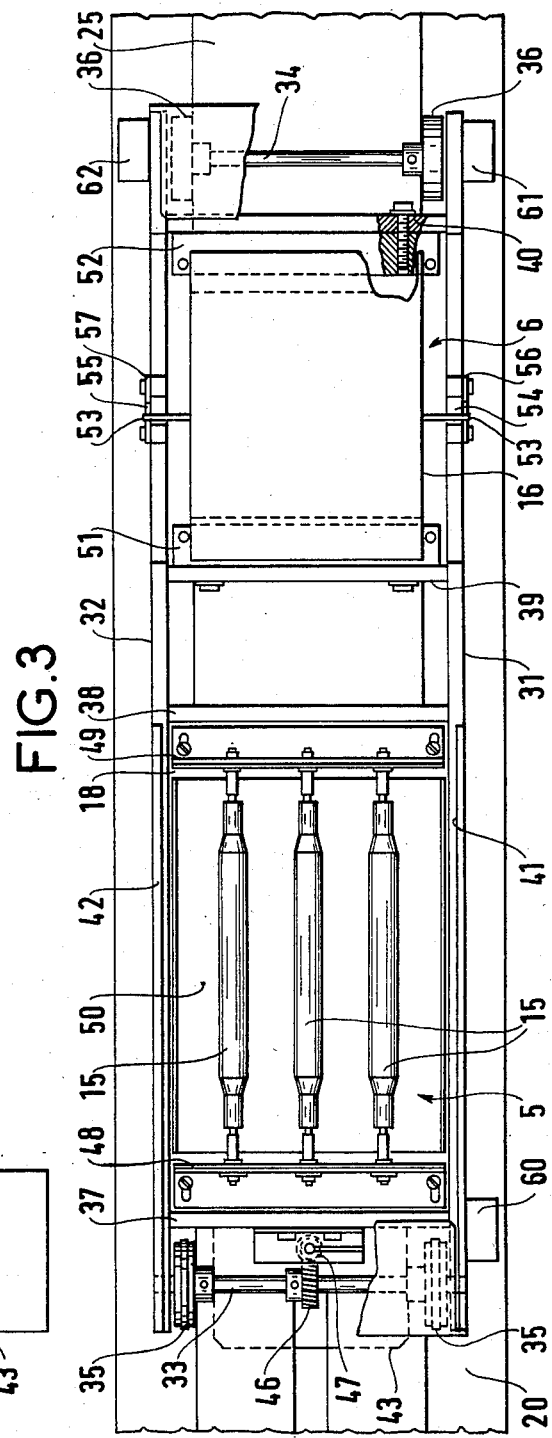

COMPONENT FIXING MACHINE FOR HYBRID CIRCUITS

The present invention relates to machines for soldering discrete components on the substrates of hybrid circuits by remelting solder. The subject matter of the invention is a machine that enables all the components to be fixed in a single operation regardless of whether the components merely rest on the surface of the substrate in question or whether they pass right through it.

BACKGROUND OF THE INVENTION

Current machines for fixing components are of the conveyor belt and oven type. In a machine of this type, the substrates on which only those components that do not pass therethrough have been positioned for soldering are themselves placed on the conveyor belt which is in the form of a metal mesh or net. These substrates are then taken into the oven and pass therethrough on the belt which is continuously driven. The substrates thus pass a short distance above the heat sources in the oven which apply increasing temperatures thereto following a working cycle defined by preheating, heating and soldering operations with the temperature generally rising in stages. The substrates are then conveyed by the same belt to a cooling station, eg. an air blower, to ensure rapid solidification of the solder joints and to cool the substrates to ambient temperature.

Such machines can only be used to fix components which do not pass through the substrate, and they therefore suffer from a first drawback of requiring components that pass through the substrate to be fixed manually afterwards.

Further, since heat is transmitted from each of the sources to the substrates through the belt, the oven also includes additional heat sources disposed above the belt in order to compensate heat dissipation and to improve the rise in temperature according to the defined cycle. Unfortunately, these additional heat sources have the drawback of also raising the temperature of the bodies, ie. the sensitive portions of the components, substantially up to the temperature of the solder joints. Such a rise in temperature of the sensitive portions of the components is excessive, and may degrade the components or may be the cause of premature ageing, at least for some components.

In such a machine the conveyor belt which is driven continuously is also the source of vibration which is transmitted directly to the substrates. Such vibration, even if only of small amplitude, is particularly damaging at the instant of solder solidification, and therefore has an effect on the quality of the solder joints made.

Also, in such a machine the rise in temperature by stages may also constitute a drawback in particular in some applications in which for reasons of reliability the components must not be subjected to heat shock.

Preferred embodiments of the present invention enable all components, including components that pass through the substrate, to be fixed in a single operation. Such embodiments of the invention also avoid the other drawbacks mentioned, and thereby enable reliable hybrid circuits.

SUMMARY OF THE INVENTION

The present invention provides a component fixing machine for fixing components to a hybrid circuit substrate by remelting solder, the machine comprising a heating station, a cooling station, and drive means for relatively displacing a substrate carrying the components and the stations, the machine including the improvement wherein the said heating station and the said cooling station are both mounted on a common carriage which is driven in translation back and forth along a guide track beneath a fixed station for holding the substrate and mounted above the said carriage.

Preferably the cooling station includes a radiator, and the carriage is equipped with means for holding the said radiator in two different possible positions which are vertically offset from each other, one of the positions being a low position and the other being a high position for the radiator on the carriage.

BRIEF DESCRIPTION OF THE DRAWINGS

An embodiment of the invention is described by way of example with reference to the accompanying drawings, in which:

FIGS. 1A and 1B are diagrams of a fixing machine in accordance with the invention, given to show the principle of its operation;

FIGS. 2 and 3 are a side view and a plan view of the moving portion of the machine in accordance with the invention;

MORE DETAILED DESCRIPTION

Figure 4:
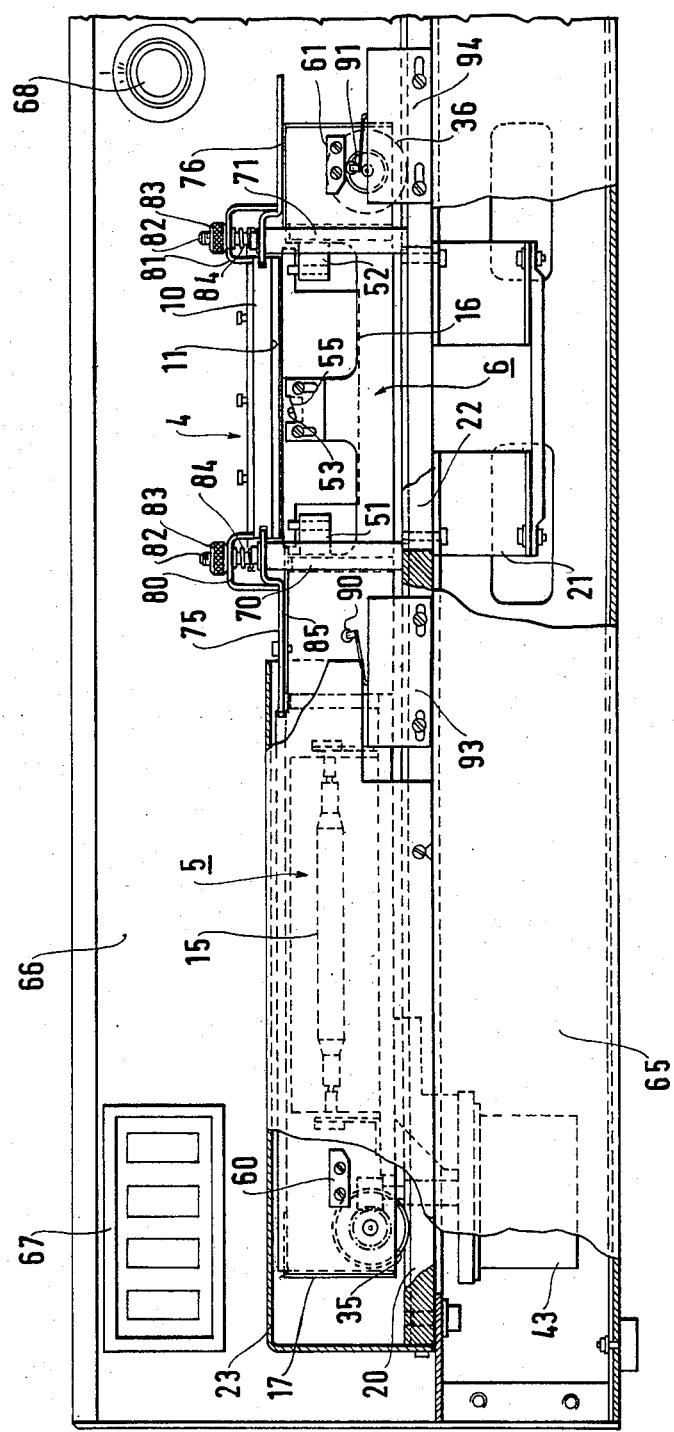
FIGS. 4 and 5 are a side view and a plan view of the machine in accordance with the invention.

FIGS. 1A and 1B show a machine for fixing discrete components in accordance with the invention and its principle of operation. Reference 1 is a substrate on which discrete components are positioned to form parts of the hybrid circuit being manufactured, some of the components such as 2 merely rest on the substrate, while others such as 3 pass through the substrate.

The machine includes a fixed substrate support station 4 for fixing the discrete components by remelting solder, a heating station 5, and a cooling station 6, both of which are movable to take up position under the fixed station 4.

The fixed station 4 is constituted by a support block 10 mounted on fixed parts of the machine. The support block 10 is made of a material which is a good conductor of heat, for example it may be made of an alloy known as duralumin (reference AU 4 G). Its lower face is advantageously, covered in a fine layer 11 of infrared absorbent material, such as borosilicate glass. A temperature probe 12 is engaged sideways in the support block 10 and enables continuous temperature monitoring. The block also has blind cavities 13 in its upper face for receiving the parts of the components that pass through the substrate.

The heating station 5 has a set of infrared lamps or tubes 15. The cooling station 6 comprises a radiator 16. The set of tubes 15 and the radiator 16 are both mounted on a common carriage 17 having respective housings 18 and 19 therefor. The opening of each of the housings in the upper face of the carriage is substantially the same size as the support block 10. The carriage 17 is movable in translation in one direction or the other over a fixed guide 20 as indicated by arrows F1 and F2 in FIGS. 1A and 1B, which show successive positions with the heating station 5 and then the cooling station 6 beneath the support block 10. The radiator 16 is itself mounted for vertical movement relative to the carriage as shown by an arrow F3 in FIG. 1B to bring it into contact with the support block 10. When the radiator 16 is in position under the support block 10 and put into contact therewith, it is associated with a fan 21 which is mounted in a fixed position relative to the machine, in an opening through a guide, track or rail 20 substantially beneath the support block 10.

In the machine, a cover 23 protects the heating station when it is moved aside to enable the cooling station 6 to be placed beneath the support block 10.

FIG. 1A corresponds to a heating operation: heat released by the tubes 15 is transmitted by the support block 10 to the substrate 1 until the solder melts at the points to be soldered. Under these conditions, the bodies of the components never directly receive the heat released by the tubes and thus remain at a temperature below the substrate temperature, which is itself below the temperature of the support block 10. The use of a solid support block interposed between the tubes 15 and the substrate 1 as described above and thus practically enclosing the tubes in their housing, together with continuous monitoring of the temperature of the support block by means of the probe, make it possible to control the substrate heating cycle and to regulate the maximum temperature not to be exceeded.

FIG. 1B corresponds to the operation of cooling the substrate. This cooling is performed simply by contacting the radiator which is associated with the fan 21 for speedier cooling, while the support block 10 bearing the substrate 1 remains fixed during both the heating and the cooling operations. Keeping the substrate fixed in this manner enables high quality soldering to be obtained.

FIGS. 2 and 3 show an embodiment of the carriage 17 mounted on a track or guide 20. The track or rail 20 is an upsidedown T-section bar with a short wide central leg 25 defining the width of the carriage guide path.

It can be seen in FIGS. 2 and 3 that the carriage 17 comprises a base plate 30 with two side plates 31 and 32 mounted thereon. Over substantially half the length of the carriage, the base plate 30 constitutes the bottom of the carriage. Two end axles 33 and 34 are mounted on the side plates and carry pairs of wheels 35 and 36 for driving the carriage along the rail 20. Two cross bars 37 and 38 followed by two more cross bars 39 and 40 divide the carriage into compartments lengthwise. They define the housing 18 for the heating station 5 in the first half of the carriage and then the housing 19 for the cooling station 6 in the other, bottomless half of the carriage. These two housings are separated from each other by a small gap.

Figure 7:
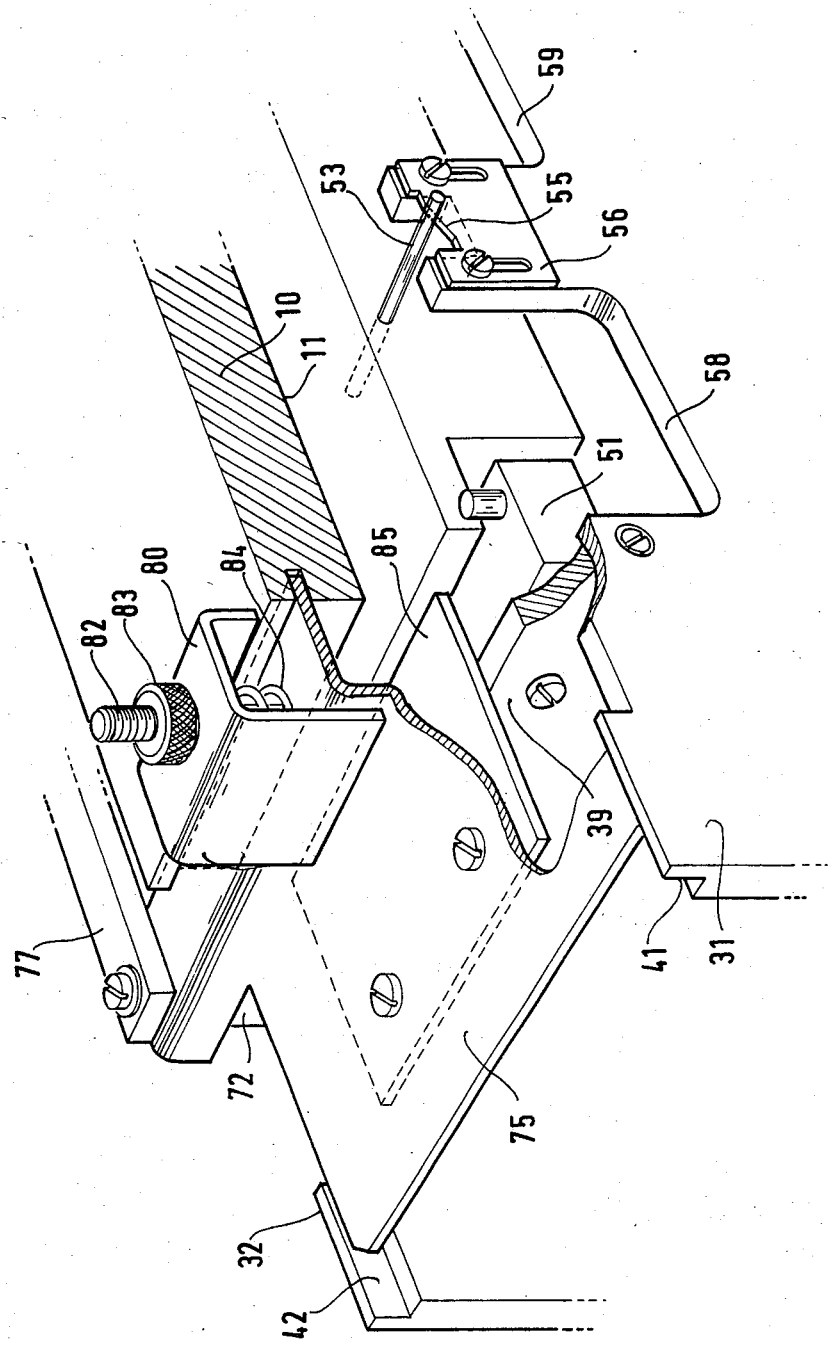
FIG. 7 is a perspective view of a portion of the machine shown in FIGS. 4 and 5.

The top longitudinal edges of the side plates 31 and 32 are machined to provide two protective rims 41 and 42 on the first half of the carriage which are slightly higher than the edges of the other half of the carriage and which provide a step in the inside face of the carriage. These two rims are clearly illustrated in FIG. 7 and their protective role is described below.

The carriage has a motor 43 for driving in either direction along the rail. The motor is mounted on a support plate 44 which is fixed to the base plate 30 substantially at the end of the carriage with resilient coupling between the support plate 44 and the bottom face of the rail 20 is provided by a curved spring blade 45, for avoiding or minimizing the transmission of vibration to the carriage. A pinion 46 is mounted on the axle 33 and is coupled to the drive shaft 47 of the motor to drive the carriage. In the embodiment shown, the motor is mounted underneath the rail 20 and its drive shaft passes through the rail 20 via a longitudinal slot 26 therein (see FIG. 6). Naturally other, equivalent dispositions for driving the carriage may be adopted in variants.

The tubes 15 of the heating station 5 are mounted on two support strips 48 and 49. These strips are of L-section and they are screwed to the base plate 30 inside the housing 18. A reflector plate 50 lines the bottom of the housing 18 giving it a cradle shape (as shown in FIGS. 1A and 1B). The power supply for the tubes is external to the carriage and is connected to the tubes by wires (not shown) running under the rail 20.

The cooling station radiator 16 is mounted with clearance in its housing 19 on two support parts 51 and 52 fixed to the cross bars 39 and 40. The radiator also has a shaft 53 running across the carriage and having ends that pass through cutouts such as 54 in each of the side plates to rest on ramps 55 formed on an external guide plates 56 and 57 fixed to the side plates 31 and 32 respectively. The clearance longitudinally adjacent to the radiator in its housing is at least equal to the maximum possible displacement of the radiator along the ramps 55 of the guide plates 56 and 57. These guide plates and their ramps serve to lift the radiator from a low position on the carriage to a high position. The corresponding command is explained below, and is illustrated in particular in FIG. 7. To increase the efficiency of the radiator 16, it may be observed that the side walls 31 and 32 have two cutouts 58 and 59 on either side of the guide plates mounted on each side wall.

In addition the carriage has three tabs 60, 61, and 62 fixed to the outside of its side walls. These tabs are intended to enable specific commands by detecting the position of the carriage along its rail. The tab 60 is attributed to the heating station and is located in a position corresponding to its housing, and the tabs 61 and 62 are attributed to the cooling station and are located in positions corresponding to the cooling station. In the example shown, these two tabs are mounted opposite each other on opposite sides of the carriage. Means for co-operating with these tabs, and the functions that result from such co-operation are described below.

Figure 5:
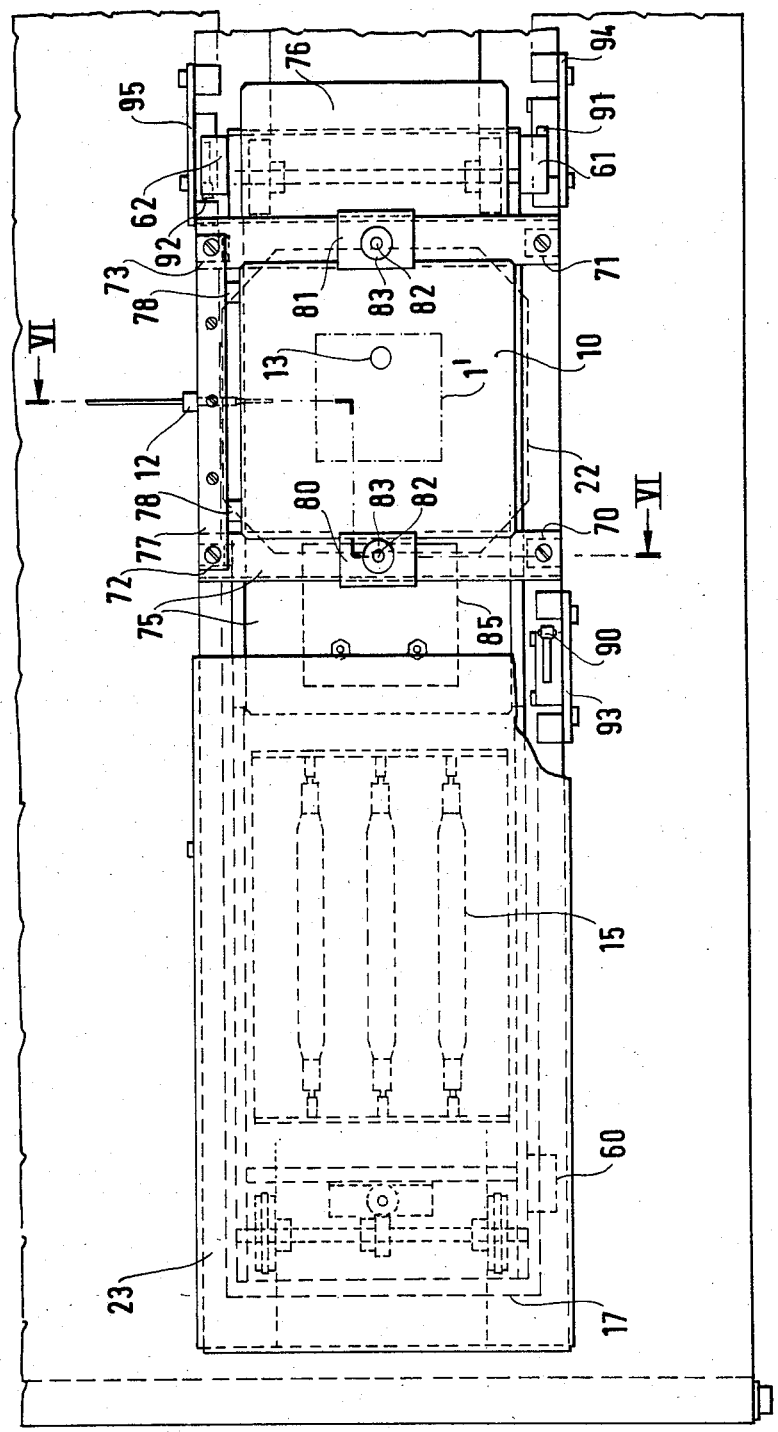
Figure 6:
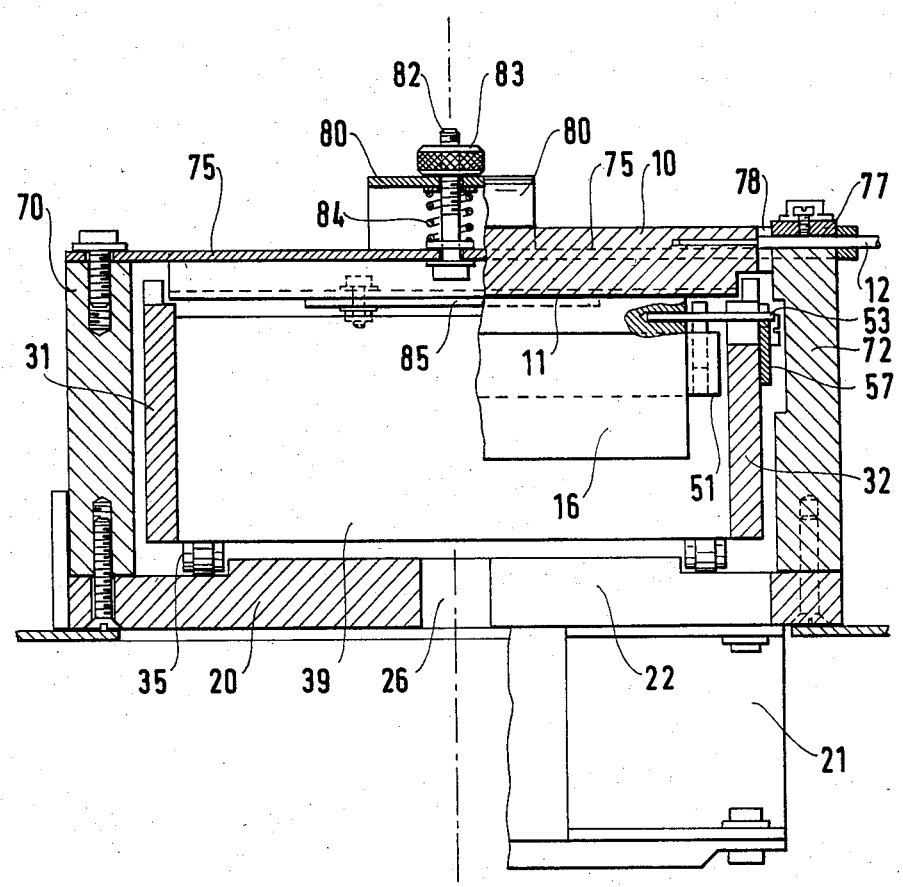
FIG. 6 is a section of the machine on a line VI—VI in FIG. 5.

FIGS. 4 to 6 show a complete machine in accordance with the invention. The description of the machine given with reference to these figures is in addition to the description of the carriage 17 carrying the heating station 5 and the cooling station 6, described above with reference to FIGS. 2 and 3. In FIGS. 4 to 6, the reference numerals used in FIGS. 1A and 1B are reused to designate the same items.

The machine is mounted on an elongate horizontal support box 65. The rail 20 is fixed on one of the largely open side faces of the box and supports the partial protection cover 23 of the carriage at the heating station end thereof. The box serves as a housing for the carriage drive motor 43 and for the fan 21 associated with the cooling station. The fan is fixed in position, and is supported by the rail opposite an opening 22 therethrough. The box also receives suitable electrical connections (not shown) for supplying power to the motor, to the fan, and to the tubes 15. A vertical panel 66 at the back of the machine is fixed to the box and carries display or indicator circuits such as 67 and manual control knobs such as 68.

In addition to the carriage 17 equipped as shown in FIGS. 2 and 3, this machine includes the fixed station 4 for holding the substrate as defined by the support block 10. In FIG. 5 the reference 1' indicates the position of the substrate on the support block 10 and the reference 13 shows the cavity in the upper face for the only through component which will be placed thereover by the substrate.

The support block 10 is held above the rail 20 by a set of four columns 70 to 73 fixed on either side of the rail 20 and by two plates 75 and 76 for guiding and holding the support block 10.

The columns 70 to 73 and the plates 75 and 76 position the support block 10 to delimit a passage between the support block and the rail for passing the carriage, the height of the passage being slightly greater than the portion of the carriage including the cooling station, but not being any greater than the portion of the carriage including the heating station. The two plates 75 and 76 are mounted across the rail and are fixed at the ends of the columns. Their facing sides running across the rail define two guide paths slightly on the inside of the columns in which the support block 10 is engaged by means of side grooves provided for the purpose. A spacer 77 parallel to the rail 20 is also fixed to the ends of the columns nearest to the panel 66. The spacer 77 carries two end stops 78 for stopping the support block when it is put into place and also serves to carry the temperature probe 12. The support block is firmly held between the columns by means of two fixing tabs 80 and 81 each having curved edges which are respectively pressed tightly against the support block 10 and the adjacent plate 75 or 76 by means of a threaded screw and nut system 82, 83 including a spring 84 held captive around the screw between the fixing tab and the plate.

The plates 75 and 76 also extend widely beyond the set of four columns 70 to 73. They are joggled so that their portions outside the columns lie just above the carriage. They thus constitute additional protection means on either side of the support block 10 which co-operate with the protection rims 41 and 42 provided in the carriage at the heating station whenever the heating station is placed beneath the support block 10, thereby preventing any heat from escaping round the edges of the support block 10. The plate 75 which is situated on the same side as the cover 23 also carries an auxiliary plate 85 fixed under the outer horizontal portion of the fixed station 4. The auxiliary plate 85 acts as a stop for the radiator 16. When the cooling station is put into place under the fixed station 4, this stop causes the radiator 16 to move from its low position on the carriage to its high position. The radiator 16 is returned from its high position to its low position when it is no longer pressed against the auxiliary plate or stop 85 by its own weight causing the shaft 53 to slide down the ramps 55. This arrangement and the end stop role of the plate 85 can be seen clearly in FIG. 7 which shows the edge of the radiator pressed against the edge of the auxiliary plate 85, thereby causing the radiator to move up to the support block 10.

With particular reference to FIGS. 4 and 5, it can be seen that the machine is further equipped with three contactor arms 90, 91, 92. These arms are placed to one side of the rail 20 to which they are fixed by support parts 93, 94, and 95 at a level suitable for engaging the tabs 60 to 62 on the carriage. Co-operation between these parts provide microswitching for specific commands to accurately position the carriage as it is moved in one direction or the other along the rail. The arms are disposed in the proximity of the fixed station 4, with the arm 90 disposed on the same side as the cover 23 for co-operating with the tab 60, and with the arms 91 and 92 disposed slightly staggered relative to each other on the other side for co-operating with the tabs 61 and 62 respectively. Thus, as the carriage moves back and forth along its rail, contact between the tab 60 and the arm 90 indicates that the heating station is positioned under the fixed station 4, while contact between the tab 61 and the arm 91, or between the tab 62 and its associated arm 92 indicates that the cooling station is positioned under the fixed station 4. However, these last two co-operating pairs also serve to indicate when the radiator is in the low position on the carriage (tab 61 and arm 91), and when the radiator is in the high position (tab 62 and arm 92). When the pair 60, 90 are in mutual contact, they operate a microswitch for interrupting the power supply to the motor to prevent carriage moving any further in its current direction of travel and for simultaneously supplying power to the tubes. When the pair 62, 92 are in mutual contact, they operate a microswitch for interrupting the power supply to the motor to prevent the carriage moving any further in the opposite direction of travel and for simultaneously applying power to the fan. The pair 61, 91 is used in conjunction with a manual control to operate a microswitch for interrupting the power supply to the motor when the radiator is under the support block 10 but in its low position on the carriage, to enable an operator to intervene on the fixed station or on the machine itself, eg. to change the support block 10. The power supply to the motor is then interrupted by the tab 61 releasing the arm 91.

The offset in the direction of carriage displacement between the arms 91 and 92 corresponds to the offset in the same direction between the top and the bottom of the each of the ramps 55. In a variant, it would naturally be possible to place the arms opposite to each other and to place the tabs associated therewith in positions which are offset in this direction.

The operation of the component fixing machine described above is given below. Once the substrate has been positioned and fixed on the support block 10, the discrete components of the hybrid circuit to be manufactured are placed on the substrate, with the machine having its cooling station 6 beneath the support block 10 at this time with the radiator in the high position. The desired temperature raising and lowering cycles are programmed in terms of the time required to reach a maximum temperature and then to return to ambient and by means of control knobs such as the knob 68 shown in FIG. 4. The operator then starts the machine so that it performs these two cycles sequentially. With the machine restarted, the motor receives power and drives the carriage to bring the heating station under the support block. The tab 60 engages the arm 90 thereby stopping the motor and simultaneously turning on the heater tubes.

The duration defined for the heating cycle gives the time that the heating station is kept under the support block 10. However, the cycle is continuously monitored as a safety precaution by taking the temperature of the support block by means of the temperature probe. These temperatures are representative of the temperatures of the support block and they are displayed on the machine's display means. Once the cycle duration has elapsed, the motor is again powered to drive the carriage in the opposite direction to before to bring the cooling station under the support block 10, into its high or cooling position. The power is removed from the heater tubes by the tab 60 disengaging the arm 90 and the carriage is stopped by the tab 62 engaging the arm 92. The fan is simultaneously turned on. The defined duration for the cooling cycle is likewise monitored by the temperature probe. At the end of cycle, which may be displayed on one of the display devices, the machine is turned off and the operator may remove the substrate in order to clean the resulting circuit, e.g. in freon baths.

The machine may receive a new substrate on which circuit components are to be fixed in two new cycles running from a machine restart, which also has the effect of turning off the fan.

If the temperatures detected by the probe and displayed during either of the cycles turn out to be incompatible with the normal operation of the cycles, either because the values measured are out of tolerance, or that they are rising or falling too slowly or too quickly or that the temperature of the support block has exceeded a maximum permitted value, the operator stops the machine for checking the settings and may operate a manual command to put the machine into an intervention condition.

This manual command turns on the carriage drive motor to move the carriage to the cooling position with the radiator in its low position on the carriage. The carriage is stopped in this intervention position by co-operation between the tab 61 and the arm 91.

The electrical circuit for controlling the machine, for enabling the motor to drive the carriage one way or the other along its rail, for stopping the carriage in various positions for operation of a heating cycle, a cooling cycle, or an intervention cycle on the basis of control signals given by the tabs and the arms, and for feeding power to the heater tubes or to the fan and for stopping then, lies within the skills of the person skilled in the art and is neither shown nor described in detail. This electric circuit may be obtained by numerous possible forms of electrical wiring. The particular form chosen is independent of the relative organization of the various stations of the machine which constitutes the subject matter of the present invention.

This organization of the machine stations has numerous advantages, of which the following may be mentioned:

components are fixed to the substrate in a single operation, ragardless of whether they pass therethrough or not;

the components are protected during the heating cycle since heat is transmitted by conduction only;

the temperature is uniform over the entire substrate;

the substrate does not vibrate; and the heating and cooling cycles may be adjusted to suit the hybrid circuits to be made, with the cycles being accurately reproducible and with continuous safety checking.

These advantages lead to highly reliable circuits being obtained.

The present invention has been described with reference to one embodiment given in the accompanying drawings. Clearly details thereof could be modified and various means could be replaced by equivalent means without going beyond the scope of the invention.

We claim:

1. A component fixing machine for fixing components to a hybrid circuit substrate by remelting solder, said machine comprising first means defining a heating station, second means defining a cooling station, and drive means for relatively displacing a substrate carrying the components and the stations, the improvement comprising a fixed station for holding the substrate, a guide track extending beneath said fixed station, a common carriage mounted for movement on said guide track, and wherein said first means defining heating station and said second means defining said cooling station are both mounted on said common carriage, and said machine further comprises means for driving said carriage in translation back and forth along said guide track beneath said fixed station.

2. A component fixing machine according to claim 1, wherein said cooling station includes a radiator, and wherein said carriage is equipped with means for holding said radiator in two different positions which are vertically offset from each other, one of the positions being a low position and the other being a high position for the radiator on the carriage with said radiator operatively contacting the substrate to remove heat therefrom.

3. A component fixing machine according to claim 2, including control means for passing the said radiator from its low position on the carriage to its high position, said control means being fixed to the fixed station to co-operate with the said means for holding the radiator when the cooling station is in position under the said fixed station.

4. a component fixing meachine according to claim 3, wherein the said means for holding the radiator are constituted by a pair of support plates carried on the sides of the carriage and each having a ramp on which the radiator rests, and the said control means are constituted by a stop plate against which the radiator comes to bear as the carriage is displaced to bring the cooling station into position under the fixed station, substantially as the cooling station comes into position under the fixed station.

5. A component fixing machine according to claim 1, wherein the said fixed station is defined by a support block made of a material which is a good conductor of heat, and having a lower face facing the carriage which is covered in an infrared absorbent deposit.

6. A component fixing machine according to claim 5, wherein a temperature probe is mounted sideways and releasably in a housing formed in the thickness of the said support block.

7. A component fixing machine according to claim 5, wherein the said fixed station further includes two plates mounted transversely to the carriage to define firstly two guide paths for the said support block which is thereby rendered removable, and secondly two protective members on either side of the support block above the said carriage.

8. A component fixing machine according to claim 1, further including at least first and second detection means associated respectively with the means defining said heating station and to the means defining said cooling station for detecting their positioning beneath the fixed station as the carriage moves one way or the other along its guide track, and means responsive to said first and second detection means for controlling the stopping of the carriage and the starting of the corresponding station defining means.

9. A component fixing machine according to clam 2, further including at least first and second detection means associated respectively with the heating station defining means and the cooling station defining means for positioning said heating station and cooling station defining means beneath the fixed station as the carriage moves one way or the other along its guide track, said first and second detection means further including means for stopping the carriage and the starting of the corresponding station defining means, together with third detection means associated with the cooling station defining means for detecting when the station defining means is positioned under the fixed station with the radiator being held in its lower position on the carriage.

10. A component fixing machine according to claim 8, wherein said detection means are each constituted by a pair of members, one of which is fixed to said carriage and the other of which is fixed to a fixed portion of said machine, said members being so positioned as to be coupled to each other when the station defining means with which they are associated is under the fixed station.

11. A component fixing machine according to claim 9, wherein said detection means are each constituted by a pair of members, one of which is fixed to said carriage and the other of which is fixed to a fixed portion of said machine, said members being so positioned as to be coupled to each other when the station defining means with which they are associated is under the fixed station.

* * * * *